(12) United States Patent
Kim

(10) Patent No.: US 8,916,887 B2
(45) Date of Patent: Dec. 23, 2014

(54) LIGHT EMITTING DEVICE PACKAGE AND LIGHTING SYSTEM USING THE SAME

(75) Inventor: Tae Jin Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 233 days.

(21) Appl. No.: 13/368,660

(22) Filed: Feb. 8, 2012

(65) Prior Publication Data

US 2013/0026500 A1    Jan. 31, 2013

(30) Foreign Application Priority Data

Jul. 29, 2011    (KR) ........................ 10-2011-0076252

(51) Int. Cl.
| | | |
|---|---|---|
| H01L 33/00 | (2010.01) | |
| C09K 11/77 | (2006.01) | |
| H01L 33/50 | (2010.01) | |
| C09K 11/08 | (2006.01) | |

(52) U.S. Cl.
CPC ............ *H01L 33/50* (2013.01); *C09K 11/7739* (2013.01); *H01L 2224/49113* (2013.01); *C09K 11/7734* (2013.01); *H01L 2224/78091* (2013.01); *C09K 11/7738* (2013.01); *C09K 11/0883* (2013.01)
USPC   257/88; 257/98; 257/E33.061; 257/E33.069; 438/34; 438/35; 313/504

(58) Field of Classification Search
USPC ......... 257/88, 98, E33.061, E33.069; 438/34, 438/35; 313/504
See application file for complete search history.

(56) References Cited

U.S. PATENT DOCUMENTS

| | | | |
|---|---|---|---|
| 2005/0057145 A1* | 3/2005 | Shieh et al. .................... | 313/503 |
| 2006/0097245 A1 | 5/2006 | Aanegola et al. | |
| 2006/0132011 A1* | 6/2006 | Shimizu et al. ............... | 313/112 |
| 2006/0186377 A1* | 8/2006 | Takahashi et al. ...... | 252/301.4 F |
| 2009/0134413 A1 | 5/2009 | Roth et al. | |
| 2009/0140630 A1* | 6/2009 | Kijima et al. ................. | 313/498 |
| 2010/0237370 A1* | 9/2010 | Kim et al. ....................... | 257/98 |
| 2011/0085352 A1 | 4/2011 | Ito et al. | |
| 2011/0180780 A1 | 7/2011 | Yoo et al. | |

FOREIGN PATENT DOCUMENTS

| | | |
|---|---|---|
| WO | WO 03/107441 A2 | 12/2003 |
| WO | WO 2005/103199 A1 | 11/2005 |

\* cited by examiner

*Primary Examiner* — Su Kim

(74) *Attorney, Agent, or Firm* — Birch, Stewart, Kolasch & Birch, LLP

(57) ABSTRACT

A light emitting device package of the embodiment includes a body including cavities; first and second lead electrodes disposed in the cavity of the body; a light emitting device disposed in the cavities, electrically connected to at least one of the first and second lead electrodes and emitting a first main peak wavelength in the range of 410~460 nm; and a first resin layer having first phosphor on the light emitting device, wherein the first phosphor of the first resin layer emits light of a second main peak wavelength in the range of 461 nm~480 nm by exciting some light having the first main peak wavelength, and the first and second main peak wavelengths have the wavelength different from each other and contain the light having the same color.

18 Claims, 8 Drawing Sheets

U.S. 8,916,887 B2

LIGHT EMITTING DEVICE PACKAGE AND LIGHTING SYSTEM USING THE SAME

The present application claims priority under 35 U.S.C. §119(a) of Korean Patent Application No. 10-2011-0076252 filed on Jul. 29, 2011, which is hereby incorporated by reference in its entirety.

BACKGROUND

The embodiment relates to a light emitting device package and a lighting system using the same.

The light emitting diode (LED) is a kind of semiconductor device converting electrical energy into light. The light emitting diode has an advantage having low power consumption, semi-permanent life, fast response velocity, safety, and environment-friendly as compared with the existing light source such as fluorescent light, incandescent. Therefore, many researches for replacing the existing light source with the light emitting diode are proceeding, and the use of the light emitting diode, which is light source of lighting apparatus such as various lamp, liquid crystal display, electronic display, and streetlight used indoors and outdoors, has been increased.

The light emitting diode may generate light energy for energy gap between a conduction band and a valance band by combining electrons of n type layer and holes of p type layer when applying forward voltage.

Nitride semiconductor, which is a kind of material of the light emitting diode, is receiving much attention in the field of optical devices and high power electronic devices by high thermal stability and wide bandgap energy. Particularly, blue LED, green LED, UV LED etc. using nitride semiconductor are commercialized and widely used.

SUMMARY

The embodiment provides a light emitting device package and a light unit using the same.

The embodiment provides a light emitting device package having main peak wavelengths of blue series different from each other and a light unit using the same.

The embodiment provides a light emitting device package capable of controlling white color using blue phosphor and blue light emitting device, and a light unit using the same A light emitting device package of the embodiment includes a body including cavities; first and second lead electrodes disposed in the body; a light emitting device disposed in the cavities, electrically connected to at least one of the first and second lead electrodes and emitting a first main peak wavelength in the range of 410~460 nm; and a first resin layer having first phosphor on the light emitting device, wherein the first phosphor of the first resin layer may emit light of a second main peak wavelength in the range of 461 nm~480 nm by exciting some light having the first main peak wavelength, and the first and second main peak wavelengths have the wavelength different from each other and contain the light having the same color.

A light emitting device package of the embodiment includes a body including first cavity; first and second lead electrodes disposed in the first cavity; a light emitting device disposed in the first cavity, electrically connected to at least one of the first and second lead electrodes and emitting a first blue wavelength; and a first resin layer disposed on the light emitting device and including first phosphor emitting a second blue wavelength longer than the first blue wavelength; wherein the first phosphor of the first resin layer emit a second blue wavelength in the range of 461 nm~480 nm.

The lighting system of the embodiment includes at least one of the light emitting device packages.

DESCRIPTION OF THE PREFERRED EMBODIMENTS

Figure 1:
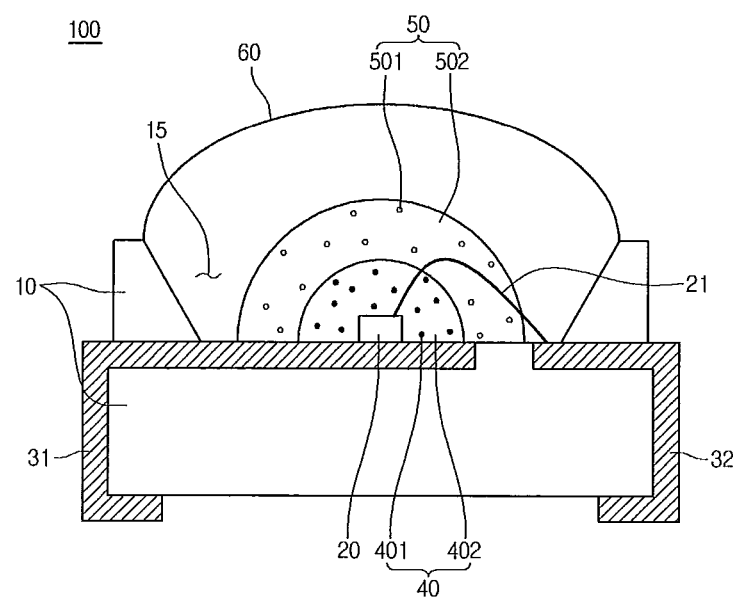
FIG. 1 is a side cross-sectional view of a light emitting device package according to a first embodiment.

In the description of the embodiment, in a case where each substrate, layer, a film or a electrode and the like is described to be formed "on" or "under" thereof "on" or "under" also means one to be formed "directly" or "indirectly (through other component)" to component. Also, the criteria regarding "on" or "under" of each component will be described based on the drawings.

In the drawing, a thickness or size of each layer is exaggerated or omitted or is schematically shown for convenience of explanation and clarity. In addition, the size of each component does not entirely reflect the actual size.

Hereinafter, the light emitting device of the embodiment will be described with reference to the attached drawing.

FIG. 1 is a side cross-sectional view of a light emitting device package 100 according to the embodiment.

Referring to FIG. 1, the light emitting package 100 of the embodiment includes a body 10, a cavity 15, first and second lead electrodes 31 and 32 disposed in the body 10, a light emitting device 20 electrically connected to the first and second lead electrodes 31 and 32 and emitting light, a connection member 21 connecting the light emitting device 20 and the second lead electrodes 32, a first resin layer 40 formed to seal the light emitting device 20, a second resin layer 50 on the first resin layer 40, and a third resin layer 60 filling the second resin layer 50 and the to cavity 15.

The body 10 may be formed by at least one of resin material such as polyphthalamide (PPA), silicon (Si), aluminum (Al), aluminum nitride (AlN), AlOx, liquid crystal polymer (PSG, photo sensitive glass), polyamide9T (PA9T), syndiotacticpolystyrene (SPS), metal material, sapphire ($Al_2O_3$), beryllium oxide (BeO), and printed circuit board (PCB). The body 10 may be formed by injection molding, etching process etc., but is not limited thereto.

When the body 10 is formed by the material having electrical conductivity, an insulation film (not shown) is formed in a surface of the body 10, thereby to prevent electrical short between the body 10 and the first and second lead electrodes 31 and 32.

Further, when the body 10 is formed by silicon (Si), the body 10 is formed with a protective device, having an integrated circuit type, such as a zener diode by a method injecting conductive dopant.

The body 10 is formed with the cavity 15 so that the top thereof is opened. The cavity 15 is separately formed by, for example, the injection molding process or the etching process of the body 10, but is not limited thereto.

The cavity 15 may be formed in a cup shape or a concave vessel shape, a side of the cavity 15 is orthogonal or inclined to a bottom surface of the cavity 15. Further, the shape of the cavity 15 as seen from the top surface is a circle, rectangle, polygon, oval etc. The cavity 15 may be formed in a cup structure by at least one of the lead electrodes 31 and 32, but is not limited thereto.

The first and second lead electrodes 31 and 32 may be disposed in the body 10 to be electrically separated from each other. The first and second lead electrodes 31 and 32 are electrically connected to the light emitting device 20 to supply power to the light emitting device 20.

One ends of the first and second lead electrodes 31 and 32 are disposed in the body 10, the other ends may be exposed to the outside or the lower surface of the body 10 through the body 10. Further, the first and second lead electrodes 31 and 32 may form the lower surface of the light emitting device package 100 while penetrating the top surface and the lower surface of the body 10. The structures of the first and second lead electrodes 31 and 32 are not limited.

The first and second lead electrodes 31 and 32 may be selectively formed using a plating method, a deposition method or a photolithographic method and are not limited thereto.

The first and second lead electrodes 31 and 32 may contain at least one material among the metal material having the electrical conductivity, for example, titanium (Ti), copper (Cu), nickel (Ni), gold (Au), chromium (Cr), tantalnyum (Ta), platinum (Pt), tin (Sn), silver (Ag), phosphorous (P), aluminium (Al), indium (In), palladium (Pd), cobalt (Co), silicon (Si), germanium (Ge), hafnium (Hf), ruthenium (Ru), or iron (Fe). Further, the first and second lead electrodes 31 and 32 may be formed to have a single layer or multilayer structures, but are not limited thereto.

The light emitting device 20 may be formed as a blue light emitting device, and is directly bonded into the first and second lead electrodes 31 and 32.

When the light emitting device 20 is, for example, a blue LED chip, the blue LED chip may has the value of a first main peak wavelength in the range of 410 nm to 460 nm, and emits the first main peak wavelength in the range of, for example, 420 nm to 450 nm. The light emitting device 20 sets balance of the white color using blue wavelength and wavelength emitted from yellow phosphor to provided white color. However, since the blue wavelength of long wavelength has low energy as compared with the blue wavelength of short wavelength, the improvement of the light emitting efficiency is limited. In the embodiment, the phosphor receive much energy toward the blue wavelength close to the wavelength of ultraviolet (UV) range, for example, toward the wavelength of 450 nm or less, for example, 420 nm±5 nm, thereby to more improve the light emitting efficiency.

The light emitting device 20 is formed by compound semiconductor of group □-□ element, for example, semiconductor material of GaN, AlN, AlGaN, InGaN, InN, InAlGaN, AlInN, AlGaAs, GaP, GaAs, GaAsP, and AlGaInP series, such that the light having the unique color of the semiconductor material may be emitted.

The light emitting device 20 may be electrically connected to the first and second lead electrode 31 and 32 by a chip bonding manner, a flip chip manner etc. and is not limited thereto.

The first resin layer 40 covers the light emitting device 20, may be formed by silicon or resin material having transparent, and includes first phosphor 401 in first resin material 402.

The first resin layer 40 may be formed by the manner filling and then, curing the silicon or the resin material in the cavity 15, but is not limited thereto.

The first phosphor 401 may be formed so that a color value of an excitation wavelength range has the same color value as the light emitting wavelength of the light emitting device 20. For example, when the light emitting device 20 is a blue LED chip, the first phosphor 401 may emit the light of a second main peak wavelength of 461 nm~480 nm, for example, the wavelength range of 470 nm±5 nm by exciting some light having the first main peak wavelength of 410 nm to 460 nm. The wavelength difference between the first and second peak wavelength is about 5 nm~69 nm, and preferably, is 45 nm~55 nm.

The first phosphor 401 are, for example, blue phosphor, the blue phosphor may contain at least one among the material of $Sr_2MgSi_2O_7:Eu^{2+}$, $BaMgAl_{10}O_{17}:Eu(Mn)$, $Sr_5Ba_3MgSi_2O_8:Eu^{2+}$, $Sr_2P_2O_7:Eu^{2+}$, $SrSiAl_2O_3N_2:Eu^{2+}$, $(Ba_{1-x}Sr_x)SiO_4:Eu^{2+}$, $(Sr,Ca,Ba,Mg)_{10}(PO_4)_6C_{12}:Eu^{2+}$, and $CaMgSi_2O_6:Eu^{2+}$, and may be formed to have the diameter of 1 μm to 10 μm. When the light emitting wavelength of the first phosphor 401 may be formed to has the value to be matched with the light emitting wavelength range of the light emitting device 20, a blue component is emitted relatively much more as compared with the light having different wavelength value by the light emitted from the light emitting device 20 and the light emitted from the first phosphor 401, thereby to increase white light efficiency while maintaining color coordinate values. Further, the wavelength components in the range of 461 nm~480 nm are emitted, thereby to maximize emotional lighting effects, such that the degree of freedom for color white balance is increased, and therefore, the control for the color coordinates is easy.

Figure 11:
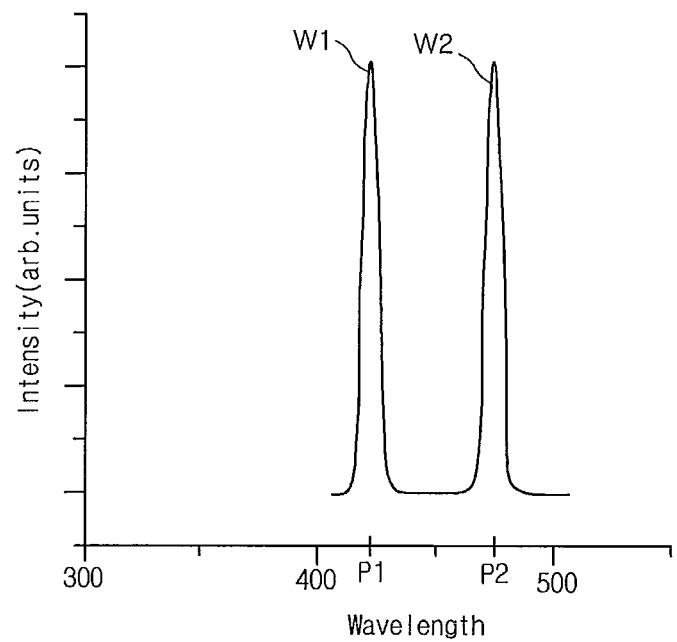
FIG. 11 shows a main peak wavelength of a first light emitting device and second phosphor of FIG. 1.

In FIG. 11, the light emitting device 20 emits the first main peak wavelength W1 of blue series having the main peak wavelength P1 of 420 nm±5 nm, and the first phosphor 401 absorbing the first main peak wavelength W1 emit the second main peak wavelength W2 of the blue series having the main peak wavelength P2 of 470 nm±5 nm. Intensity of the second main peak wavelength W2 may be lower than the intensity of the first main peak wavelength W1, and may have the intensity of about 70~95% as compared with the intensity of the first main peak wavelength W1.

The light emitting device 20 emits the light of a first blue wavelength, and the first phosphor 401 emits the light of a second blue wavelength longer than the first blue wavelength. The second blue wavelength emits the main peak wavelength in the range of 460 nm~470 nm.

The first resin material 402 may contain transparent resin series, and may include a silicon resin or epoxy resin in consideration of light refractive index and thermal properties. The silicon resin has small thermo chromic phenomenon, and therefore, change of the physical properties due to high temperature of the light emitting device 20 is improved.

The second resin layer 50 may be formed by the shape covering at least portion of the first resin layer 40. The second resin layer 50 may be formed so that second phosphor 501 is included in second resin material 502. The second resin material 502 may include the transparent resin material such as the silicon resin or the epoxy resin like the first resin material 402, and may be formed by filling the resin material into the first resin layer 40 and then, curing it. The shape of the first resin layer 40 may be a convex lens having a curved surface, or a flat shape, and the shape of the second resin layer 50 may be the shape of convex lens having a curved surface, or a flat shape. The curved surface or the flat shape of the first and second resin layer 40, 50 may be the shape of the surface emitting the light.

The second phosphor 501 may emit second light by absorbing and exciting at least one of the light of the first main peak wavelength emitted from the light emitting device 20 and the light of the second main peak wavelength emitted from the first phosphor 401. For example, the second phosphor 501 may contain at least one of red phosphor, green phosphor, and yellow phosphor, and may contain all of the red phosphor, green phosphor, and yellow phosphor. The light generated from the light emitting device 20 is incident on the second phosphor 501 to emit as the light of different wavelength. The second phosphor 501, which are the phosphor emitting the light of long wavelength as compared with the blue wavelength, may contain at least one of YAG, TAG, silicate, nitride, oxynitride-based material.

The red phosphor may contain at least one of $La_2O_2S:Eu^{3+}$, $Y_2O_2S:Eu^{3+}$, $Y_2O_3:Eu^{3+}(Bi^{3+})$, $CaS:Eu^{2+}$, $(Zn,Cd)S:Ag^+$ $(Cl^-)$, $K_5(WO_4)_{625}:Eu^{3+}{}_{25}$, and $LiLa_2O_2BO_3:Eu^{3+}$. The green phosphor may contain at least one of $ZnS:Cu^+(Al^{3+})$, $SrGa^2S^4:Eu^{2+}$, $CaMgSi_2O_7:Eu_{2+}$, $Ca_8Mg(SiO_4)Cl_2:Eu^{2+}$ $(Mn^{2+})$, and $(Ba,Sr)_2SiO_4:Eu^{2+}$. The yellow phosphor may contain at least one of $Y_3Al_5O_{12}:Ce^{3+}$, and $Sr_2SiO_4:Eu^{2+}$. The main peak wavelength emitted by the red phosphor is in the range of 600~630 nm, the main peak wavelength emitted by the green phosphor is in the range of 525~535 nm, and the main peak wavelength emitted by the yellow phosphor is in the range of 510~525 nm. The wavelength of the blue series is increased by the light emitting device 20 and the first phosphor 401, thereby to increase the light emitting efficiency by the second phosphor 501, that is, the red, green and red phosphor. Therefore, the emotional lighting effect of 461 nm~480 nm may be maximized, and the degree of freedom for the white balance is also increased, thereby to efficiently control the color coordinates.

The third resin layer 60 may be formed to cover all of the second resin layer 50 and the cavity 15. The third resin layer 60 may be formed by molding the epoxy or silicon resin in the present embodiment. The second resin layer 50 is disposed between a first resin layer 40 and a third resin layer 60. In addition, in the third resin layer 60, a light emitting surface of a top end thereof may be formed by the convex lens having the curved surface or the flat shape, and may emit the light obtained while passing through the first resin layer 40 and the second resin layer 50 outside. The third resin layer 60 further contains the first phosphor, and may be formed by the transparent resin layer separated from the first phosphor.

At least one surface of the first to third resin layer 40, 50 and 60 may be formed as a convex-concave surface, and the convex-concave surface refracts the light to improve a light orientation angle.

The content of the first phosphor 401 in the first resin layer 40 are different from the content of the second phosphor in the second resin layer 50, for example, the content of the first phosphor 401 in the first resin layer 40 have the content larger than the content of the second phosphor in the second resin layer 50.

The first to third resin layers 40, 50 and 60 are the transparent resin layer, the third resin layer 60 may be formed by the material having the refractive index lower than the refractive index of the second resin layer 50, and the second resin layer 50 may be formed by the material having the refractive index lower than the refractive index of the first resin layer 40. The refractive index of the first to third resin layers 40, 50 and 60 may be formed by the material of 2 or less, for example, 1.6 or less. Here, the refractive indexes of the first and second resin layers 40 and 50 may be same, and may be formed by the same resin material.

The first phosphor may be added in the body 10. The reflectivity of the body 10 is 70% or more, and transmission coefficient thereof is under 10%. The first phosphor may emit the main peak wavelength of 461 nm~480 nm by changing the wavelength of the light transmitting the body 10.

Figure 2:
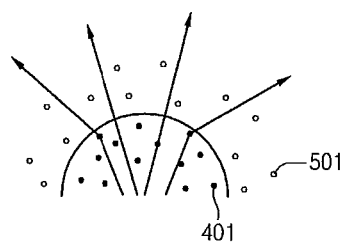
FIG. 2 shows light path of light emitted from a light emitting device of FIG. 1.

In FIG. 2, the angle of the light incident on the first phosphor 401 may be changed and reflected, and the first phosphor 401 may emit by scattering the light.

If the diameters of the first phosphor 401 are small, the diffusion effect of the light is insufficient, and if the diameters of the first phosphor 401 are excessively increased, there is a problem that the phosphor absorbs the light. Therefore, the first phosphor 401 may be formed to have the size minimizing absorption of the light, for example, the diameter of 1 μm to 10 μm.

The first phosphor 401 may scatter a significant portion of the light emitted from the light emitting device 20. Thus, the light passing through the first resin layer 40 may be evenly mixed without partiality, whereby the light reduced with color deviation may be obtained in the top of the second resin layer 50.

Figure 3:
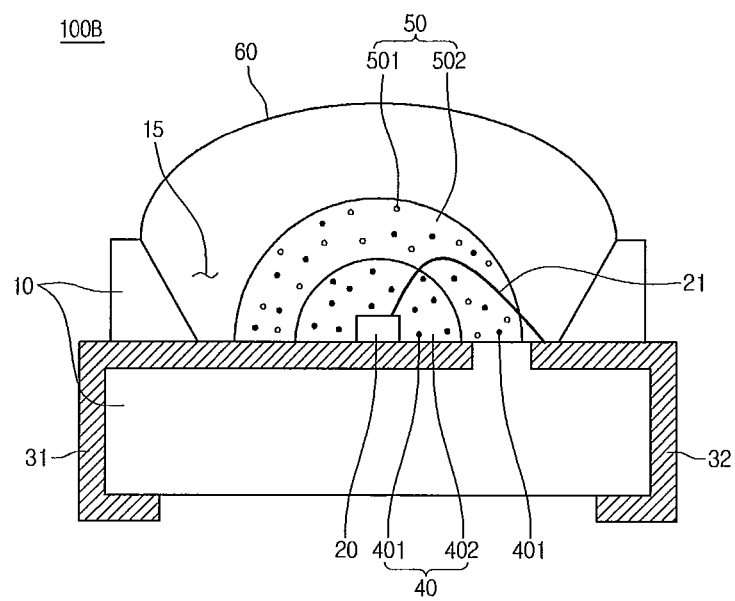
FIG. 3 shows the light emitting device package according to a second embodiment.

FIG. 3 shows the light emitting device package 100B according to a second embodiment. When describing the second embodiment, the same portions as the first embodiment use the same reference numerals, and the duplicated description will be omitted.

In FIG. 3, a first resin layer 40 and a second resin layer 50 are disposed on a cavity 15 of the body 10, and first phosphor 401 and second phosphor 402 are added in the second resin material 502 of the second resin layer 50. The first phosphor 401 included in the second resin layer 50 is formed separately with the first phosphor 401 included in the first resin layer 40, and the first phosphor 401 in the first resin layer 40 and the first phosphor 401 in the second resin layer 50 emit the light in the range of 461 nm~480 nm at the resin layers different from each other, thereby to increase the blue light and generate the emotional lighting effect.

Figure 4:
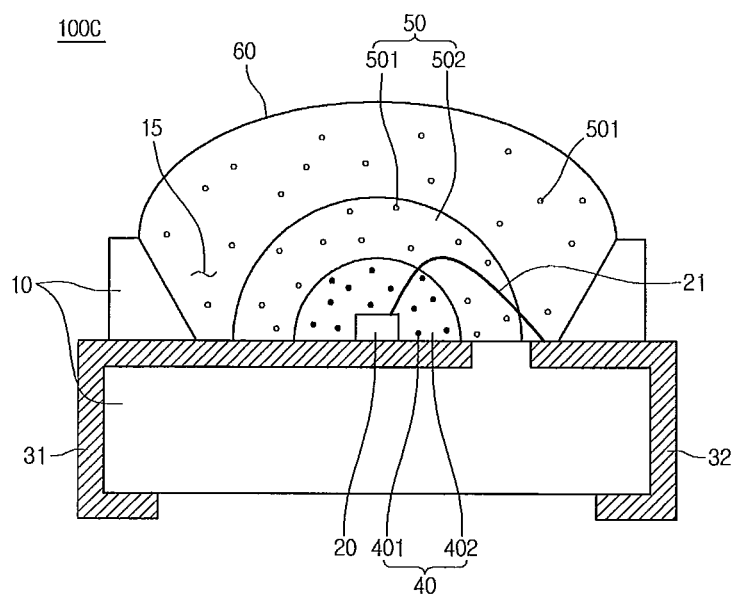
FIG. 4 shows the light emitting device package according to a third embodiment.

FIG. 4 shows the light emitting device package 100C according to a third embodiment. When describing the third embodiment, the same portions as the first embodiment use the same reference numerals, and the duplicated description will be omitted.

In FIG. 4, the third resin layer 60 may cover the first resin layer 40 and the second resin layer 50, the first phosphor 401 may be included in the third resin layer 60. Since the first phosphor 401 is included in the third resin layer 60, the diffusion effect for the light having the blue wavelength may be increased, thereby to easily control the color coordinates.

When the shape of the third resin layer 60 is formed by a lens type in which the height of the portion to be formed at the top in the direction orthogonal to the light emitting device 20 is high and the height is lowered toward surroundings, since the amount of the first phosphor 401 included at the top of the light emitting device 20 are increased, thereby to effectively scatter more blue light concentrated toward the center across the whole area of the top.

As described above, the first phosphor 401 is formed to emit the light of excitation wavelength corresponding to the light emitting wavelength of the light emitting device 20 to change the wavelength and to scatter the light, and particularly, may improve the phenomenon allowing the light to be vertically weighted from a vertical light emitting device.

Figure 5:
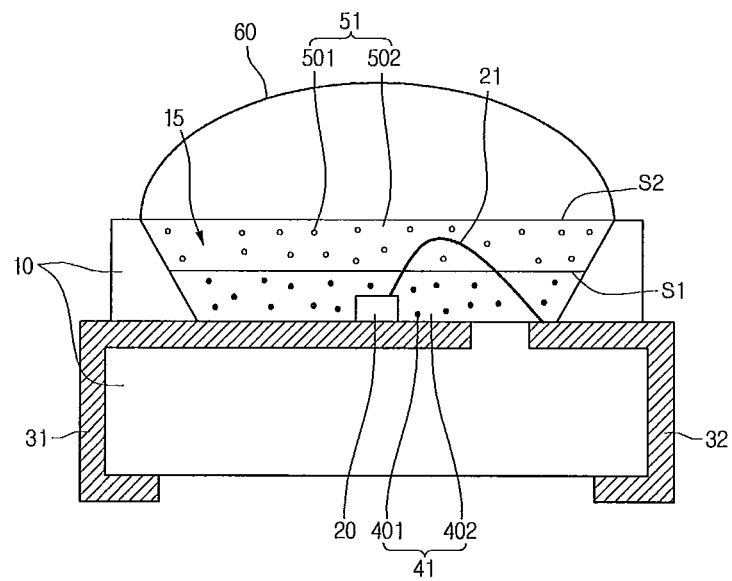
FIG. 5 shows the light emitting device package according to a fourth embodiment.

FIG. 5 shows the light emitting device package according to a fourth embodiment. When describing the fourth embodiment, the same portions as the first embodiment use the same reference numerals, and the duplicated description will be omitted.

Referring to FIG. 5, the light emitting package may include a body 10, a cavity 15, first and second lead electrodes 31 and 32 disposed in the body 10, a light emitting device 20 electrically connected to the first and second lead electrodes 31 and 32 and emitting the light, a connection member 21 connecting the light emitting device 20 and the second lead electrodes 32, a first resin layer 41 formed to seal the light emitting device 20, a second resin layer 51 on the first resin layer 41, and a third resin layer 60 filling the second resin layer 51 and the cavity 15. The connection member 21 may be a wire.

A top surface S1 of the first resin layer 41 is formed by a flat surface, a top surface S2 of the second resin layer 51 is formed by the flat surface. The first resin layer 41 is disposed between the second resin layer 51 and the bottom of the cavity 15, and the second resin layer 51 is disposed between the first resin layer 41 and the third resin layer 60. A top surface S1 of the first resin layer 41 may be disposed in the cavity 15 lower than the top surface of the body 10, and is not limited thereto.

The first resin layer 41 is formed with first phosphor 401, and the second resin layer 51 is formed with second phosphor 501

A top surface S2 of the second resin layer 51 is disposed on the same plane as the top surface of the body 10, and may be disposed on different plane.

Figure 6:
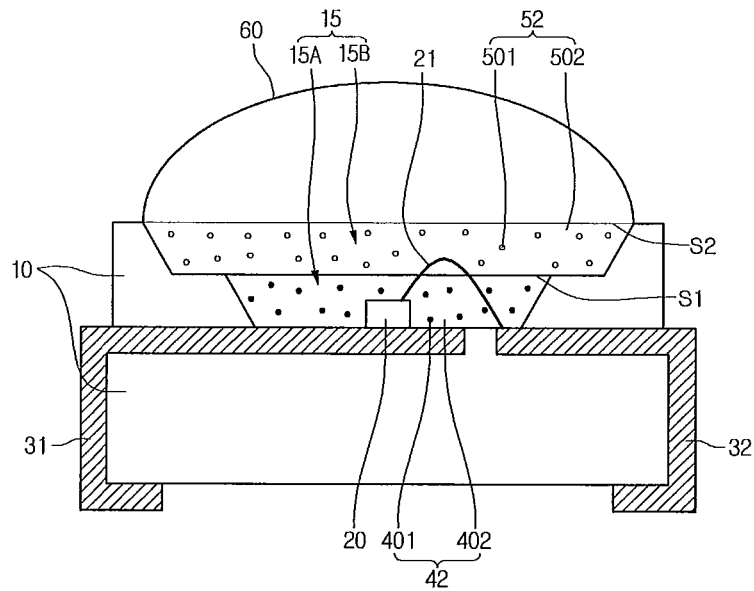
FIG. 6 shows the light emitting device package according to a fifth embodiment.

FIG. 6 shows the light emitting device package according to a fifth embodiment. When describing the fifth embodiment, the same portions as the first embodiment use the same reference numerals, and the duplicated description will be omitted.

Referring to FIG. 6, the light emitting device package may include a body 10, a cavity 15, first and second lead electrodes 31 and 32 disposed in the body 10, a light emitting device 20 electrically connected to the first and second lead electrodes 31 and 32 and emitting the light, a connection member 21 connecting the light emitting device 20 and the second lead electrode 32, a first resin layer 42 formed to seal the light emitting device 20, a second resin layer 52 on the first resin layer 42, and a third resin layer 60 filling the second resin layer 52 and the cavity 15.

The cavity 15 includes a first cavity 15A in which the first resin layer 42 is disposed, and a second cavity 15B in which the second resin layer 52 is formed. A width of the top of the first cavity 15A may be formed narrower than the width of the top of the second cavity 15B. Therefore, side surfaces of the inside of the cavity 15 may be formed as a stepped structure having at least two stages. Further, the side of the first cavity 15A and the second cavity 15B may be formed to be inclined at the angles different from each other, and is not limited thereto.

Figure 7:
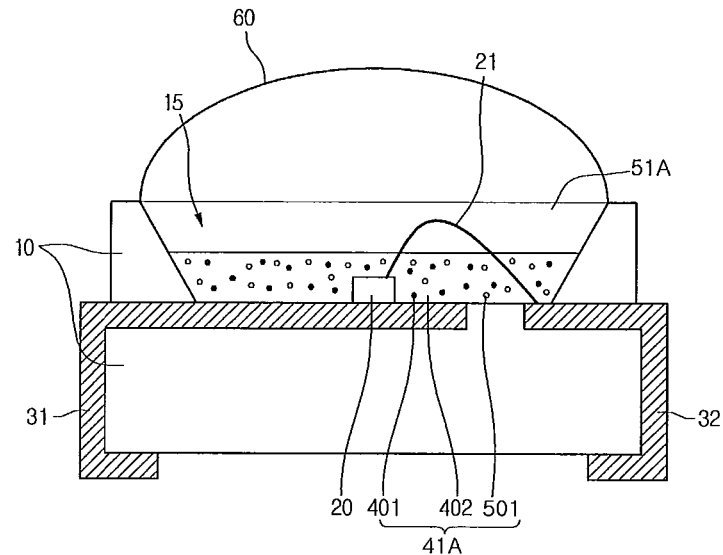
FIG. 7 shows the light emitting device package according to a sixth embodiment.

FIG. 7 shows the light emitting device package according to a sixth embodiment. When describing the sixth embodiment, the same portions as the first embodiment use the same reference numerals, and the duplicated description will be omitted.

Referring to FIG. 7, the light emitting package may include a body 10, a cavity 15, first and second lead electrodes 31 and 32 disposed in the body 10, a light emitting device 20 electrically connected to the first and second lead electrodes 31 and 32 and emitting the light, a connection member 21 connecting the light emitting device 20 and the second lead electrodes 32, a first resin layer 41A formed to seal the light emitting device 20, a second resin layer 51A on the first resin layer 41A, and a third resin layer 60 filling the second resin layer 51A and the cavity 15.

The first phosphor 401 and the second phosphor 502 may be added in the first resin material 402 of the first resin layer 41A. In FIG. 11, the light emitting device 20 emits the first main peak wavelength W1 of blue series having the main peak wavelength P1 of 420 nm±5 nm, and the first phosphor 401 absorbing the first main peak wavelength W1 emit the second main peak wavelength W2 of blue series having the main peak wavelength P2 of 470 nm±5 nm. Intensity of the second main peak wavelength W2 may be lower than the intensity of the first main peak wavelength W1, and may have the intensity of about 70~95% as compared with the intensity of the first main peak wavelength W1.

The second phosphor 501 may emit second light by absorbing and exciting at least one of the light of the first main peak wavelength emitted from the light emitting device 20 and the light of the second main peak wavelength emitted from the first phosphor 401. For example, the second phosphor 501 may contain at least one of red phosphor, green phosphor, and yellow phosphor, and may contain all of the red phosphor, green phosphor, and yellow phosphor.

The blue having main peak wavelength different from each other and a second color having the peak wavelength of 510 nm or more may be emitted through the first resin layer 41A.

The second resin layer 51A is separated from different phosphor, and may be defined as the transparent resin layer that does not have the phosphor.

Figure 8:
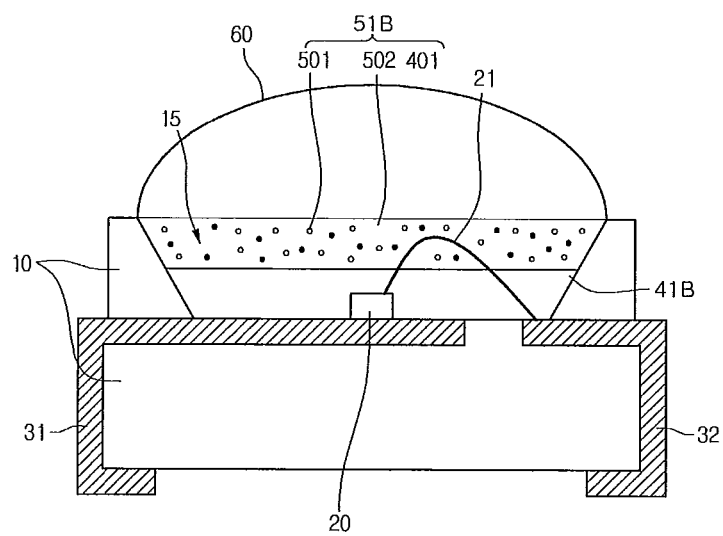
FIG. 8 shows the light emitting device package according to a seventh embodiment.

FIG. 8 shows the light emitting device package according to a seventh embodiment. When describing the seventh embodiment, the same portions as the first to embodiment use the same reference numerals, and the duplicated description will be omitted.

Referring to FIG. 8, the light emitting package may include a body 10, a cavity 15, first and second lead electrodes 31 and 32 disposed in the body 10, a light emitting device 20 electrically connected to the first and second lead electrodes 31 and 32 and emitting the light, a connection member 21 connecting the light emitting device 20 and the second lead electrodes 32, a first resin layer 41B formed to seal the light emitting device 20, a second resin layer 51B on the first resin layer 41B, and a third resin layer 60 filling the second resin layer 51B and the cavity 15.

The first resin layer 41B is formed as the transparent resin layer that does not have the phosphor.

The first phosphor 401 and the second phosphor 502 may be added in the second resin material 502 of the second resin layer 51B. The light emitting device 20 emits the first main peak wavelength W1 of blue series having the main peak wavelength of 420 nm, and the first phosphor 401 absorbing the first main peak wavelength W1 emit the second main peak wavelength W2 of blue series having the main peak wavelength P2 of 470 nm±5 nm. Intensity of the second main peak wavelength W2 may be lower than the intensity of the first main peak wavelength W1, and may have the intensity of about 70~95% as compared with the intensity of the first main peak wavelength W1.

The second phosphor 501 may emit second light by absorbing and exciting at least one of the light of the first main peak wavelength emitted from the light emitting device 20 and the light of the second main peak wavelength emitted from the first phosphor 401. For example, the second phosphor 501 may contain at least one of red phosphor, green phosphor, and yellow phosphor, and may contain all of the red phosphor, green phosphor, and yellow phosphor.

The blue having main peak wavelength different from each other and the second color having the peak wavelength of 510 nm or more may be emitted through the second resin layer 51B.

Figure 9:
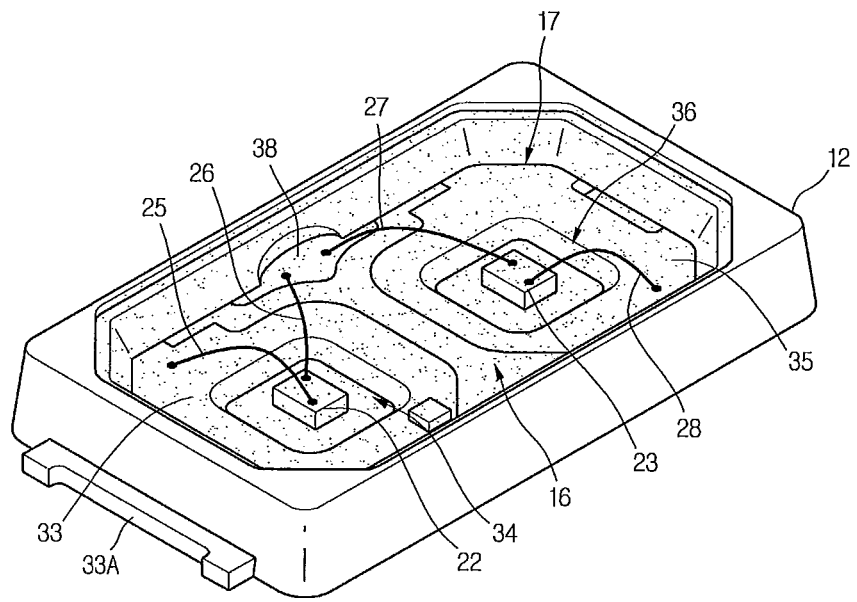
FIG. 9 shows the light emitting device package according to an eighth embodiment.
Figure 10:
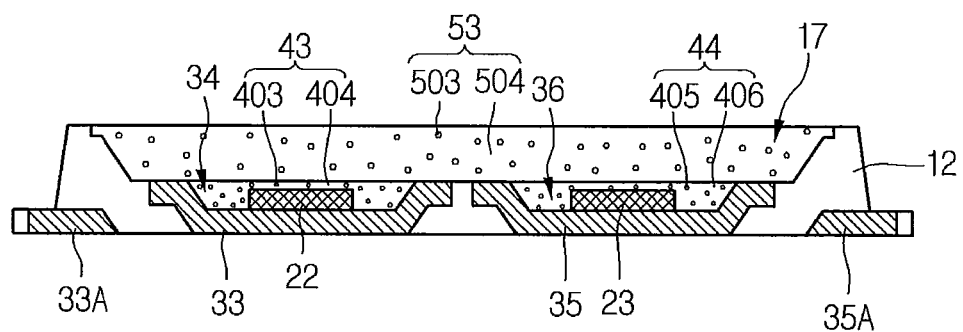
FIG. 10 is a side cross-sectional view of the light emitting device of FIG. 9.

FIG. 9 shows the light emitting device package according to an eighth embodiment, and FIG. 10 is a side cross-sectional view of the light emitting device package of FIG. 9. When describing the eighth embodiment, the same portions as the first embodiment use the same reference numerals, and the duplicated description will be omitted.

Referring to FIGS. 9 and 10, the light emitting device package includes a body 12 having a first cavity 17, a first lead electrode 33 having a second cavity 34, a second lead electrode 35 having a third cavity 36, a connecting frame 38, light emitting chips 22 and 23, and wires 25 to 28.

The body 12 may be formed by at least one of resin material such as polyphthalamide (PPA), silicon (Si), metal material, photo sensitive glass (PSG), sapphire ($Al_2O_3$), and printed circuit board (PCB). Preferably, the body 12 may be formed by at least one of plastic resin material such as polyphthalamide (PPA) and silicon material.

The shape of the top surface of the body 12 may have various shapes such as triangle, quadrangle, polygon and circle etc. according to use and design of the light emitting device package. The first lead electrode 33 and the second lead electrode 35 are disposed on the lower of the body 12 and may be mounted on the substrate in a direct lighting type. The first lead electrode 33 and the second lead electrode 35 are disposed on the side of body 12 and may be mounted on the substrate in an edge type, but are not limited thereto.

The top of the body 12 is opened, and has a first cavity 17 forming the side surface and the bottom surface. The first cavity 17 may include a concave cup or a recess structure from the top surface of the body 12, and is not limited thereto. The side of the cavity 17 may be orthogonal or inclined to the bottom surface of the cavity 17.

The shape of the cavity 17 as seen from the top surface may be a circle, ellipse, polygon (for example, quadrangle). A corner of the cavity 17 may be the curved surface or a flat surface.

The first lead electrode 33 is disposed on the first region of the first cavity 17, and the portion of the first lead electrode 33 is disposed on the bottom surface of the first cavity 17. A concave second cavity 34 is disposed to have a depth lower than the bottom surface of the first cavity 17 in the center thereof. The second cavity 34 is a concave shape from the top surface of the first lead electrode 33 to the lower surface of the body 12, and includes, for example, the cup structure or the recess shape. The side of the second cavity 34 is inclined or may be orthogonally bended to the bottom surface of the second cavity 34. Two sides facing each other among the side of the second cavity 34 may be inclined at the same angle or at different angle from each other.

The second lead electrode 35 is disposed on the second region to be spaced apart from the first region of the first cavity 17, and the portion of the second lead electrode 33 is disposed on the bottom surface of the first cavity 17. A concave third cavity 36 is formed to have a depth lower than the bottom surface of the first cavity 17 in the center thereof. The third cavity 36 is the concave shape from the top surface of the second lead electrode 113 to the lower surface of to the body 12, and includes, for example, the cup structure or the recess shape. The side of the third cavity 36 is inclined or may be orthogonally bended to the bottom surface of the third cavity 36. Two sides facing each other among the side of the third cavity 36 may be inclined at the same angle or at different angle from each other.

The top of the first lead electrode 33 is disposed in correspondence with the top of the second lead electrode 35 at the center of the body 12, but is not limited thereto.

The lower surfaces of the first lead electrode 33 and the second lead electrode 35 are exposed to the lower surface of the body 12, or may be disposed on the same plane as the lower surface of the body 12.

A first lead 33A of the first lead electrode 33 is disposed on the lower surface of the body 12, and may be protruded from a first side 113 of the body 12. A second lead 35A of the second lead electrode 35 is disposed on the lower surface of the body 12, and may be protruded from a second side 114 facing the first side of the body 12.

A connecting frame 38 is disposed in one side of the region between the first lead electrode 33 and the second lead electrode 35, and is disposed adjacently to the first side 113 of the body 12. The connecting frame 38 connects the light emitting chips 22, 23.

The first lead electrode 33, the second lead electrode 35, and the connecting frame 38 may contain at least one of metal material, for example, titanium (Ti), copper (Cu), nickel (Ni), gold (Au), chromium (Cr), tantalnyum (Ta), platinum (Pt), tin (Sn), silver (Ag), phosphorus (P), and may be formed by a single metal layer or multilayer metal layers. The thicknesses of the first and second lead electrodes 33 and 35, and the connecting frame 38 may be formed as the same thickness, and are not limited thereto.

The bottom shape of the second cavity 34 and the third cavity 36 may be rectangle, square, or circle or ellipse having the curved surface.

The first light emitting chip 22 is disposed in the second cavity 34 of the first lead electrode 33, and the second light emitting chip 23 is disposed in the third cavity 36 of the second lead electrode 31.

The first light emitting chip 22 may be connected to the first lead electrode 33 and the connecting frame 38 disposed in the bottom of the cavity 17 by first and second wires 25 and 26. The second light emitting chip 23 may be connected to the connecting frame 38, and the first lead electrode 33 disposed in the bottom of the cavity 17 by first and second wires 27 and 28.

The protection device may be disposed in the predetermined region of the first cavity 17, the protection device may be implemented by thyristor, zener diode or transient voltage suppression (TVS), and the zener diode protects the light emitting chip from electro static discharge (ESD).

The light emitting device 22 and 23 include the compound semiconductor of group III-V element, and emit the blue wavelength, for example, the wavelength in the range of 410 nm~460 nm. The first light emitting device 22 may emit the main peak wavelength in the range of 410 nm~440 nm of 410 nm~460 nm, and the second light emitting device 23 may emit the main peak wavelength different from the main peak wavelength of the first light emitting device 22, for example, the main peak wavelength in the range of 430 nm~460 nm.

As another example, the first light emitting device 22 and the second light emitting device 23 may emit the same wavelength as the main peak wavelength or the main peak wavelength having the difference in the wavelength of at least 1 nm.

The second cavity 34 of the body 12 is formed with a resin layer 43, the third cavity 36 is disposed with a second resin layer 44, and the first cavity 17 is formed with a third resin layer 53.

The first resin layer 43 includes a first resin material 404, and first phosphor 404 added in the first resin material 404. The second resin layer 44 includes a second resin material 406, and second phosphor 405 added in the second resin material 406. The third resin layer 53 includes a third resin material 504, and third phosphor 503 added in the third resin material 504. The first to third resin material 404,406,504 may be formed by the transparent resin material such as silicon or epoxy.

The first phosphor 403 are blue phosphor, and the blue phosphor may include at least one among, for example, $Sr_2MgSi_2O_7:Eu^{2+}$, $BaMgAl_{10}O_{17}:Eu(Mn)$, $Sr_5Ba_3MgSi_2O_8:Eu^{2+}$, $Sr_2P_2O_7:Eu^{2+}$, $SrSiAl_2O_3N_2:Eu^{2+}$, $(Ba_{1-x}Sr_x)SiO_4:Eu^{2+}$, $(Sr,Ca,Ba,Mg)_{10}(PO_4)_6Cl_2:Eu^{2+}$, and $CaMgSi_2O_6:Eu^{2+}$.

The second phosphor 405 are blue phosphor, and the blue phosphor may include at least one among, for example, $Sr_2MgSi_2O_7:Eu^{2+}$, $BaMgAl_{10}O_{17}:Eu(Mn)$, $Sr_5Ba_3MgSi_2O_8:Eu^{2+}$, $Sr_2P_2O_7:Eu^{2+}$, $SrSiAl_2O_3N_2:Eu^{2+}$, $(Ba_{1-x}Sr_x)SiO_4:Eu^{2+}$, $(Sr,Ca,Ba,Mg)_{10}(PO_4)_6Cl_2:Eu^{2+}$, and $CaMgSi_2O_6:Eu^{2+}$.

The first phosphor 403 may emit the main peak wavelength in the range of the blue wavelength range, for example, 465 nm~475 nm by exciting the light in the range of 410 nm~440 nm emitted from the first light emitting device 22. The second phosphor 405 may emit at the range of the blue wavelength, for example, 469 nm~480 nm by exciting the light in the range of 430 nm~460 nm emitted from the second light emitting device 23. The main peak wavelength of the second phosphor 405 may emit the light having the wavelength longer than the first phosphor 403.

As another example, the first and second light emitting device 22 and 23 may emit at the range of 410 nm~440 nm or 430 nm~460 nm. In this case, the first phosphor 403 may emit the main peak wavelength in the range of the blue wavelength, for example, 465 nm~475 nm by exciting the light emitted from the first light emitting device 22. The second phosphor 405 may emit at the range of the blue wavelength range, for example, 469 nm~480 nm by exciting the light in the range of 410 nm~460 nm emitted from the second light emitting device 23. The main peak wavelength of the second phosphor 405 may emit the light having the wavelength longer than the first phosphor 403.

The first and second phosphor 403 and 405 may emit the light having the wavelength longer than the main peak wavelength of the first and second light emitting devices 22 and 23. The difference in the light emitting wavelengths between the first and second phosphor 403 and 405 and between the first and second light emitting devices 22 and 23 may be 5 nm~69 nm.

The third phosphor 503 may include at least one among red, yellow and greed phosphor. The third phosphor 503 may emit the light having the wavelength longer than the blue wavelength by exciting the portion of the light emitted from the first light emitting device 22, the second light emitting device 23, and the first and second phosphor 403 and 405. The first phosphor may further be added into the third resin material 504.

When the light emitting wavelengths of the first and second phosphor 403 and 405 may be formed to have the value to be matched with the light emitting wavelength ranges of the light emitting devices 22 and 23, a blue component is emitted relatively much more as compared with the light having different wavelength value by the light emitted by the light emitting device 22 and 23 and the light emitted from the first and second phosphor 403 and 405, thereby to increase white light efficiency while maintaining color coordinate values. Further, the wavelength component in the range of 470 nm±5 nm is emitted, thereby to maximize emotional lighting effects, such that the degree of freedom for color white balance is increased, and therefore, the control for the color coordinates is easy.

The lens may be further formed on the top of the body 12, the lens may include the structure of concave or/and convex lens, and light distribution of the light emitted by the light emitting device may be controlled.

In the embodiment, two cavities are disposed on the regions different from each other in the light emitting device package, but at least three cavities may be disposed on the regions different from each other. Further, two light emitting devices are disposed in the light emitting device package, but at least three light emitting devices may be disposed, and are not limited thereto.

Figure 12:
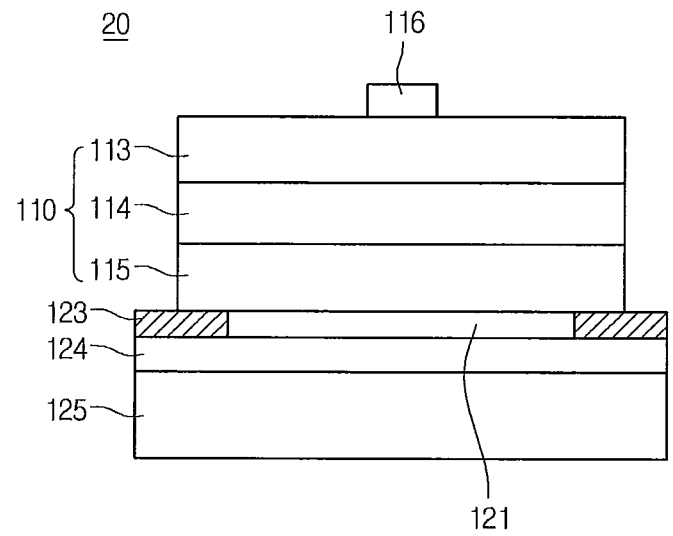
FIG. 12 shows an example for the light emitting device of FIG. 1.

FIG. 12 shows the light emitting device of the embodiment.

Referring to FIG. 12, the light emitting device 20 comprises a light emitting structures 110, a ohmic layer 121 under the light emitting structures 110, a reflection layer 124 under the ohmic layer 121, a conductive supporting member 125 under the reflection layer 124, and a protection layer 123 around the reflection layer 124 and the light emitting structures 110.

The light emitting structures 110 includes a first conductive semiconductor layer 113, a second conductive semiconductor layer 115, and an active layer 114 between the first conductive semiconductor layer 113 and the second conductive semiconductor layer 115.

The first conductive semiconductor layer 113 may be selected from compound semiconductor of group III-V doped with the first conductive dopant, for example, GaN, AlN, AlGaN, InGaN, InN, InAlGaN, AlInN, AlGaAs, GaP, GaAs, GaAsP, AlGaInP etc. When the first conductive semiconductor layer is n-type semiconductor, the first conductive dopant contains n-type dopant such as Si, Ge, Sn, Se, and Te. The first conductive semiconductor layer 113 may be formed by a single layer or multilayer, and is not limited thereto.

The active layer 114 may be formed as a single quantum well structure, a multi quantum well structure, a quantum-line structure, and a quantum-dot structure. The active layer 114 may be formed by cycle of the well layer a2nd the barrier layer, for example, the cycle of InGaN well layer/GaN barrier layer or InGaN well layer/AlGaN barrier layer using the compound semiconductor material of group III-V element. The well layer of the active layer 114 having the main peak wavelength of 410~460 nm may contain indium content in the range of 3~15%. When lowering the indium content of the well layer, light emits to short wavelength range rather than long wavelength range.

The conductive cladding layer may be formed on or/and under the active layer 114, and the conductive cladding layer may be formed by AlGaN-based semiconductor.

The second conductive semiconductor layer 115 is formed under the active layer 114, the second conductive semiconductor layer 115 may be selected from compound semiconductor of group III-V doped with the second conductive dopant, for example, GaN, AlN, AlGaN, InGaN, InN, InAlGaN, AlInN, AlGaAs, GaP, GaAs, GaAsP, AlGaInP etc. When the second conductive semiconductor layer is p-type semiconductor, the second conductive dopant contains p-type dopant such as Mg, Ze etc. The second conductive semiconductor layer 115 may be formed by a single layer or multilayer, and is not limited thereto.

Further, the third conductive semiconductor layer, for example, n-type semiconductor layer may be formed under the second conductive semiconductor 115. The light emitting structures 135 may be formed by at least one of n-p junction, p-n junction, n-p-n junction, p-n-p junction.

The ohmic layer 121 is ohmic-contacted with lower layer of the light emitting structures 110, for example, the second conductive semiconductor 115, and the material thereof may be formed among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), Ag, Ni, Al, Rh, Pd, Ir, Ru, Mg, Zn, Pt, Au, Hf, and the material composed by their selective combination. Further, the ohmic layer 121 may be formed with multi-layer using the metal material and the transparent conductive material such as IZO, IZTO, IAZO, IGZO, IGTO, AZO, ATO, and may be laminated with, for example, IZO/Ni, AZO/Ag, IZO/Ag/Ni, AZO/Ag/Ni etc. A layer blocking current to be corresponded with the electrode 116 may be further formed in the inside of the ohmic layer 121.

The protection layer 123 may be selectively formed among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $SiO_2$, SiOx, SiOxNy, $Si_3N_4$, $Al_2O_3$, $TiO_2$ etc. The protection layer 123 may be formed by sputtering method or deposition method, and may prevent the metal such as the reflection layer 124 from shorting the layers of the light emitting structures 110.

The reflection layer 124 may be formed as Ag, Ni, Al, Rh, Pd, Ir, Ru, Mg, Zn, Pt, Au, Hf and the material composed by their selective combination. The reflection layer 124 may be formed larger than the width of the light emitting structures 110, whereby the light reflection efficiency may be improved.

The conductive supporting member 125, which is base substrate, may be formed by copper (Cu), gold (Au), nickel (Ni), molybdenum (Mo), copper-tungsten (Cu—W), carrier wafer such as Si, Ge, GaAs, ZnO, SiC etc. A bonding layer may be further formed between the conductive supporting member 125 and the reflection layer 124, and the boding layer may bond to two layers.

The light emitting chip disclosed above, which is an example, is not limited to the characteristics disclosed above. The light emitting chip is selectively applied to the embodiment of the light emitting device, and is not limited thereto.

Figure 14:
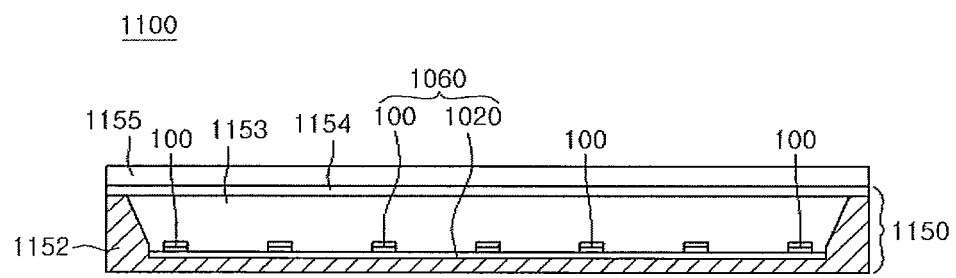
FIG. 14 is a prospective view showing another example of the display having the light emitting device package of FIG. 1.
Figure 15:
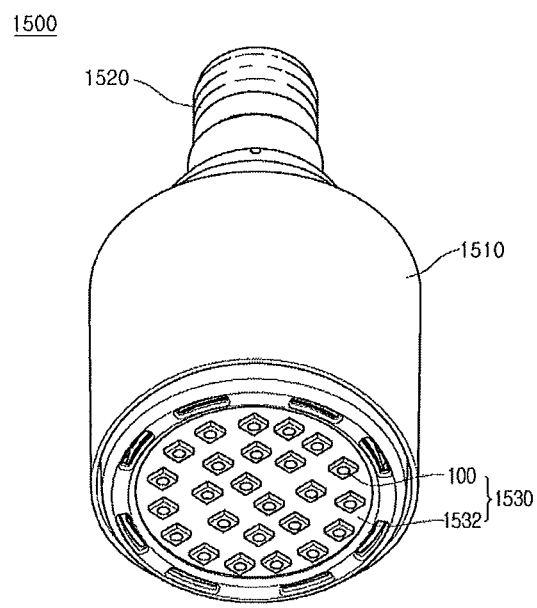
FIG. 15 shows a lighting system having the light emitting device package of FIG. 1.

The light emitting device package of the embodiment may be applied to the lighting system. The lighting system includes the structure arrayed with a plurality of light emitting package, includes a display as shown in FIGS. 13 and 14 and a lighting apparatus as shown in FIG. 15, and may be also applied to the units such as lighting, traffic light, vehicle headlight, electronic display, indicator lamp.

Figure 13:
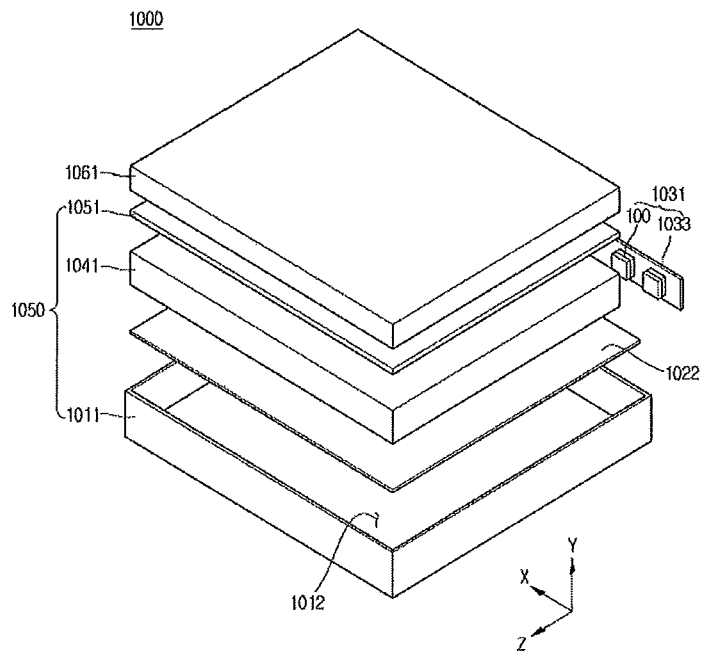
FIG. 13 is a prospective view showing an example of a display having the light emitting device package of FIG. 1.

FIG. 13 is a disassembled prospective view of the display of the embodiment.

In FIG. 13, a display 1000 may include a light guide plate 1041, a light emitting module 1031 providing the light to the light guide plate 1041, a reflection member 1022 under the light guide plate 1041, an optical sheet 1051 on the light guide plate 1041, a display panel 1061 on the optical sheet 1051, and a bottom cover 1011 receiving the light guide plate 1041, the light emitting module 1031, the reflection member 1022, but is not limited thereto.

The bottom cover 1011, the reflection member 1022, the light guide plate 1041, and the optical sheet 1051 may be defined as light unit 1050.

The light guide plate 1041 functions as the surface light source by diffusing the light provided from the light emitting module 1031. The light guide plate 1041 is formed by a transparent material, and may contain, for example, one of acrylic resin such as polymethyl metaacrylate (PMMA), polyethylene terephthlate (PET), poly carbonate (PC), cycloolefin copolymer (COC) and polyethylene naphthalate (PEN) resin.

The light emitting module 1031 is disposed on at least one side of the light guide plate 1041, supplies the light to at least one side of the light guide plate 1041, and acts as the light source of the display.

At least one light emitting module 1031 is disposed in the bottom cover 1011, and to may supply the light directly or indirectly from one side of the light guide plate 1041. The light emitting module 1031 includes a substrate 1033, and the light emitting device package 100 of the embodiment disclosed above, and the light emitting device package 100 may be arrayed on the substrate 1033 at a predetermined interval. The substrate may be printed circuit board, but is not limited thereto. Further, the substrate 1033 may include Metal Core PCB (MCPCB), flexible PCB (FPCB) etc, but is not limited thereto. When the light emitting device package 100 is mounted on the side of the bottom cover 1011 or on a heat radiating plate, the substrate 1033 may be removed. The portion of the heat radiating plate may be contacted on the top surface of the bottom cover 1011. Therefore, the heat generated from the light emitting device package 100 may be discharged into the bottom cover 1011 via the heat radiating plate.

The plurality of the light emitting device packages 100 may be mounted on the substrate 1033 so that a light emitting surface on which the light is emitted is spaced at a predetermined interval from the light guide plate 1041, but are not limited thereto. The light emitting device packages 100 may directly or indirectly supply the light to one side of the light guide plate 1041, that is, a light-entering face, but are not limited thereto.

The reflection member 1022 may be disposed under the light guide plate 1041. The reflection member 1022 reflects the light that is incident on the lower surface of the light guide plate 1041 to supply to the display panel 1061, thereby to improve the brightness of the display panel 1061. The reflection member 1022 may be formed by, for example, PET, PC, PVC resin, etc., but is not limited thereto. The reflection member 1022 may be the top surface of the bottom cover 1011, but is not limited thereto.

The bottom cover 1011 may accommodate the light guide plate 1041, the light emitting module 1031 and the reflection member 1022 etc. To this end, the top surface of the bottom cover 1011 may be formed with an accommodating portion 1012 having opened box shape, but is not limited thereto. The bottom cover 1011 may be coupled with a top cover (not shown), but is not limited thereto.

The bottom cover 1011 may be formed by the metal material or the resin material, and may be manufactured by the processes such as press molding or extrusion molding etc. Further, the bottom cover 1011 may contain the metal or nonmetal material having excellent thermal conductivity, but is not limited thereto.

The display panel 1061, which is, for example, an LCD panel, includes first and second substrates having the transparent material facing each other, and a liquid crystal layer interposed between the first and second substrates. At least one surface of the display panel 1061 may be mounted with a polarizing plate, but is not limited to the attachment structure of the polarizing plate. The display panel 1061 transmits or blocks the light provided from the light emitting module 1031 to display information. Such a display 1000 may be applied to various kinds of handheld terminal, monitor of notebook computer, monitor of laptop computer, and display unit such as television set.

The optical sheet 1051 is disposed between the display panel 1061 and the light guide plate 1041, and includes at least one transparent sheet. The optical sheet 1051 may include at least one among the sheet such as, for example, diffusion sheet, horizontal/vertical prism sheet, and brightness enhanced sheet etc. The diffusion sheet diffuses incident light, the horizontal/vertical prism sheet collects the incident light into the display panel 1061, and the brightness enhanced sheet reuse the light to be lost to improve the brightness. Further, the protection sheet may be disposed on the display panel 1061, but is not limited thereto.

The light guide plate 1041 and the optical sheet 1051, which is optical member, may be included on the optical path of the light emitting module 1031, but is not limited thereto.

FIG. 14 shows the display having the light emitting device package of the embodiment.

In FIG. 14, the display 1100 includes a bottom cover 1152, a substrate 1120 arrayed with the light emitting device package 100 disclosed above, an optical member 1154 and a display panel 1155.

The substrate 1120 and the light emitting device package 100 may be defined as the light emitting module 1060. The bottom cover 1152, at least one light emitting module 1060 and the optical member 1154 may be defined as the light unit 1150.

The bottom cover 1152 is provided with a receiving portion 1153, but is not limited thereto.

The optical member 1154 may include at least one among the lens, the light guide plate, diffusion sheet, horizontal/vertical prism sheet, and brightness enhanced sheet etc. The light guide plate may be formed by PC material or poly methy methacrylate (PMMA) material, and the light guide plate may be removed. The diffusion sheet diffuses incident light, the horizontal/vertical prism sheets collect the incident light into the display panel 1155, and the brightness enhanced sheet reuses the light to be lost to improve the brightness.

The optical member 1154 is disposed on the light emitting module 1060, functions the light emitted from the light emitting module 1060 as surface light source, and performs diffusion and collecting etc.

FIG. 15 shows a prospective view of the lighting system of the embodiment.

In FIG. 15, the lighting system 1500 may include a case 1510, lighting emitting modules 1530 disposed in the case 1510, and a connecting terminal 1520 disposed in the case 1510 and receiving power from external power source It is preferable to form the case 1510 by the material having an excellent heat radiating characteristic, and the excellent material is, for example, the metal material or the resin material.

The lighting emitting modules 1530 may include a substrate 1532, and lighting emitting device packages 100 mounted in the substrate 1532. A plurality of lighting emitting device packages 100 may be arrayed to be spaced in a matrix type or at the predetermined interval.

The substrate 1532, in which circuit pattern is printed on an insulator, may include for example, printed circuit board (PCB), metal core PCB, flexible PCB, ceramic PCB etc.

Further, the substrate 1532 may be formed by the material efficiently reflecting the light, or may become coating layer with colors, for example, white, silver, etc. efficiently reflecting the light on the surface.

At least one lighting emitting device packages 100 may be mounted on the substrate 1532. Each of the light emitting device package 100 may include at least one light emitting diode (LED) chip. The LED chip may include light emitting diode in the range of visible ray such as red, green, blue or white etc., or UV light emitting diode emitting ultra violet (UV).

The light emitting module 1530 may be disposed to have combinations of various light emitting device packages 100 to obtain colors and brightness. For example, to secure high color rendition (CRI), it is possible to arrange the combined white light emitting diode, red light emitting diode, and green light emitting diode.

The connecting terminal 1520 is electrically connected to the light emitting module 1530 to supply the power. The connecting terminal 1520 is turned by a socket scheme so as to be inserted into the external power source, but is not limited thereto. For example, the connecting terminal 1520 may be formed by a pin type, and therefore, is inserted into the external power source, or may be connected to the external power source by wiring.

As described above, the lighting system of the embodiment may improve light efficiency and may be efficiently applied to emotional lighting by including the light emitting device or the light emitting device package of the embodiment.

According to an embodiment of the present invention, the light emitting may improve the emotional lighting effect using the emitted light.

Further, in the embodiment, the light efficiency of the light emitting device package may be improved.

In the embodiment, the light emitting device package having small color deviation, and the light unit using the same may be provided.

Any reference in this specification to "one embodiment," "an embodiment," "example embodiment," etc., means that a particular feature, structure, or characteristic described to in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package, comprising:
a body including a cavity;
first and second lead electrodes disposed in the cavity of the body;
a light emitting device disposed in the cavity, electrically connected to at least one of the first and second lead electrodes and emitting a first main peak wavelength in the range of 410~460 nm;
a first resin layer having first phosphor on the light emitting device;
a second phosphor emitting light of a third main peak in the cavity; and
a second resin layer on the first resin layer, and the first phosphor in the second resin layer,
wherein the first phosphor of the first resin layer emits light of a second main peak wavelength in the range of 461 nm~480 nm by exciting some light having the first main peak wavelength, and the first and second main peak wavelengths have the wavelength different from each other and contain light having a same color,
wherein the light emitting device is a blue LED chip,
wherein the first phosphor is a blue phosphor,
wherein the first phosphor emits a blue light having a wavelength difference of 5 nm to 69 nm from the first main peak wavelength, and
wherein the second phosphor emits the light of the third main peak longer than the second main peak.

2. The light emitting device package according to claim 1, wherein the light emitting device emits the light of the first main peak wavelength in the range of 420 nm±5 nm, and the first phosphor emits the light of the second main peak wavelength in the range of 470 nm±5 nm.

3. The light emitting device package according to claim 1, wherein the second phosphor is disposed in the second resin layer, and
wherein the second phosphor include at least two of red, green, and yellow phosphors.

4. The light emitting device package according to claim 3, wherein the light emitted from the light emitting device, the first and second phosphors are mixed color into white light.

5. The light emitting device package according to claim 3, further comprising a transparent resin layer separated from the first and second phosphors under the first resin layer.

6. The light emitting device package according to claim 1, wherein the first phosphor include at least one selected from the group consisting of $BaMgAl_{10}O_{17}:Eu(Mn)$, $Sr_5Ba_3MgSi_2O_8:Eu^{2+}$, $Sr_2P_2O_7:Eu^{2+}$, $SrSiAl_2O_3N_2:Eu^{2+}$, $(Ba_{1-x}Sr_x)SiO_4:Eu^{2+}(0<x<1)$, $(Sr,Ca,Ba,Mg)_{10}(PO_4)_6C_{12}:Eu^{2+}$, and $CaMgSi_2O_6:Eu^{2+}$.

7. The light emitting device package according to claim 1, wherein a diameter of the first phosphor is formed in the range of 1 μm to 10 μm.

8. The light emitting device package according to claim 1, further comprising a transparent third resin layer separated from the first phosphor on the second resin layer.

9. The light emitting device package according to claim 8, further comprising a third phosphor in the third resin layer, wherein the third phosphor emits blue light having a wavelength difference of 5 nm to 69 nm from the first main peak wavelength.

10. A light emitting device package, comprising:
a body including a first cavity;
first and second lead electrodes disposed in the first cavity;
a light emitting device disposed in the first cavity, electrically connected to at least one of the first and second lead electrodes and emitting a first blue wavelength;
a first resin layer disposed on the light emitting device and including first phosphor emitting a second blue wavelength longer than the first blue wavelength;
a second phosphor emitting light of wavelength longer than the second blue wavelength in the first cavity; and
a second cavity of the first lead electrode recessed from a bottom surface of the first cavity, and a third cavity of the second lead electrode recessed from a bottom surface of the first cavity,
wherein the light emitting device includes a first light emitting device disposed in the second cavity and a second light emitting device disposed in the third cavity, and the first light emitting device and the second light emitting device emit main peak wavelengths different from each other,
wherein the first and second light emitting devices are the blue LED chip,
wherein the first phosphor of the first resin layer emits a second blue wavelength in the range of 461 nm~480 nm,
wherein the light emitting device is a blue LED chip,
wherein the first phosphor is a blue phosphor, and
wherein the first phosphor emits the second blue wavelength having a wavelength difference of 5 nm to 69 nm from the first blue wavelength.

11. The light emitting device package according to claim 10, wherein the wavelength difference between the first and second blue wavelength is about 45~55 nm.

12. The light emitting device package according to claim 10, wherein the first light emitting device emits the main peak wavelength of 410 nm~430 nm, and the second light emitting device emits the light of the wavelength longer than the first light emitting device.

13. The light emitting device package according to claim 12, wherein the first resin layer is disposed in the second cavity and third cavity, the first phosphor of the first resin layer disposed in the second cavity emit the main peak wavelength in the range of 465 nm~475 nm, and the first phosphor of the first resin layer disposed in the third cavity emit the main peak wavelength in the range of 469 nm~480 nm.

14. The light emitting device package according to claim 13, further comprising a second resin layer including second phosphor on the first resin layer,
wherein the second phosphor emit the light of the wavelength longer than the second blue wavelength, and
wherein the second phosphor includes a yellow phosphor and a red phosphor.

15. The light emitting device package according to claim 14, wherein the lights emitted from the light emitting device, the first and second phosphor are mixed to be white light.

16. The light emitting device package according to claim 13, further comprising a third resin layer including the first phosphor on the second resin layer,
wherein the content of the first phosphor of the third resin layer is different from the content of the first phosphor of the first resin layer.

17. A lighting system, comprising:
a substrate; and
a plurality of light emitting device package disposed on the substrate,
wherein the light emitting device package includes:
a body including cavities;

first and second lead electrodes disposed in the cavity of the body;

a light emitting device disposed in the cavity, electrically connected to at least one of the first and second lead electrodes and emitting a first main peak wavelength in the range of 410 ~460 nm;

a first resin layer having first phosphor on the light emitting device;

a second phosphor emitting light of a third main peak in the cavity; and a second resin layer on the first resin layer, and the first phosphor in the second resin layer, wherein the first phosphor of the first resin layer emits light of a second main peak wavelength in the range of 461 nm~480 nm by exciting some light having the first main peak wavelength, and the first and second main peak wavelengths have the wavelength different from each other and contain light having a same color, wherein the light emitting device is a blue LED chip, wherein the first phosphor is a blue phosphor, wherein the first phosphor emits a blue light having a wavelength difference of 5 nm to 69 nm from the first main peak wavelength, and wherein the second phosphor emits the light of the third main peak longer than the second main peak.

18. The light emitting device package according to claim 3, wherein a content of the first phosphor in the first resin layer has the content greater than a content of the second phosphor in the second resin layer.

* * * * *